(12) United States Patent
Lu et al.

(10) Patent No.: US 11,211,122 B1
(45) Date of Patent: Dec. 28, 2021

(54) INCREASE OF A SENSE CURRENT IN MEMORY

(71) Applicant: Micron Technology, Inc., Boise, ID (US)

(72) Inventors: Zhongyuan Lu, Boise, ID (US); Robert J. Gleixner, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/004,177

(22) Filed: Aug. 27, 2020

(51) Int. Cl.
*G11C 11/00* (2006.01)
*G11C 13/00* (2006.01)

(52) U.S. Cl.
CPC .......... *G11C 13/004* (2013.01); *G11C 13/003* (2013.01); *G11C 13/0069* (2013.01); *G11C 2213/15* (2013.01)

(58) Field of Classification Search
CPC .. G11C 13/004; G11C 13/003; G11C 13/0069
USPC ........................................................ 365/148
See application file for complete search history.

(56) References Cited

U.S. PATENT DOCUMENTS

| 2006/0285391 A1* | 12/2006 | Cernea | G11C 11/5642 365/185.22 |
| 2012/0069674 A1* | 3/2012 | Lee | G11C 16/3459 365/185.19 |

OTHER PUBLICATIONS

U.S. Appl. No. 16/729,731, entitled, "Three-State Programming of Memory Cells", filed Dec. 30, 2019, 35 pages.
U.S. Appl. No. 16/729,787, entitled, "Multi-State Programming of Memory Cells", filed Dec. 30, 2019, 48 pages.

* cited by examiner

*Primary Examiner* — Vu A Le
(74) *Attorney, Agent, or Firm* — Brooks, Cameron & Huebsch, PLLC

(57) ABSTRACT

The present disclosure includes apparatuses, methods, and systems for increase of a sense current in memory. An embodiment includes a memory having a plurality of memory cells, and circuitry configured to count a number of program operations performed on the memory cells of the memory during operation of the memory, and increase a magnitude of a current used to sense a data state of the memory cells of the memory upon the count of the number of program operations reaching a threshold count.

24 Claims, 6 Drawing Sheets

INCREASE OF A SENSE CURRENT IN MEMORY

TECHNICAL FIELD

The present disclosure relates generally to semiconductor memory and methods, and more particularly, to increase of a sense current in memory.

BACKGROUND

Memory devices are typically provided as internal, semiconductor, integrated circuits and/or external removable devices in computers or other electronic devices. There are many different types of memory including volatile and non-volatile memory. Volatile memory can require power to maintain its data and can include random-access memory (RAM), dynamic random access memory (DRAM), and synchronous dynamic random access memory (SDRAM), among others. Non-volatile memory can provide persistent data by retaining stored data when not powered and can include NAND flash memory, NOR flash memory, read only memory (ROM), and resistance variable memory such as phase change random access memory (PCRAM), resistive random access memory (RRAM), magnetic random access memory (MRAM), and programmable conductive memory, among others.

Memory devices can be utilized as volatile and non-volatile memory for a wide range of electronic applications in need of high memory densities, high reliability, and low power consumption. Non-volatile memory may be used in, for example, personal computers, portable memory sticks, solid state drives (SSDs), digital cameras, cellular telephones, portable music players such as MP3 players, and movie players, among other electronic devices.

Resistance variable memory devices can include resistance variable memory cells that can store data based on the resistance state of a storage element (e.g., a memory element having a variable resistance). As such, resistance variable memory cells can be programmed to store data corresponding to a target data state by varying the resistance level of the memory element. Resistance variable memory cells can be programmed to a target data state (e.g., corresponding to a particular resistance state) by applying sources of an electrical field or energy, such as positive or negative electrical pulses (e.g., positive or negative voltage or current pulses) to the cells (e.g., to the memory element of the cells) for a particular duration. A state of a resistance variable memory cell can be determined by sensing current through the cell responsive to an applied interrogation voltage. The sensed current, which varies based on the resistance level of the cell, can indicate the state of the cell.

Various memory arrays can be organized in a cross-point architecture with memory cells (e.g., resistance variable cells) being located at intersections of a first and second signal lines used to access the cells (e.g., at intersections of word lines and bit lines). Some resistance variable memory cells can comprise a select element (e.g., a diode, transistor, or other switching device) in series with a storage element (e.g., a phase change material, metal oxide material, and/or some other material programmable to different resistance levels). Some resistance variable memory cells, which may be referred to as self-selecting memory cells, can comprise a single material which can serve as both a select element and a storage element for the memory cell.

DETAILED DESCRIPTION

Figure 1:
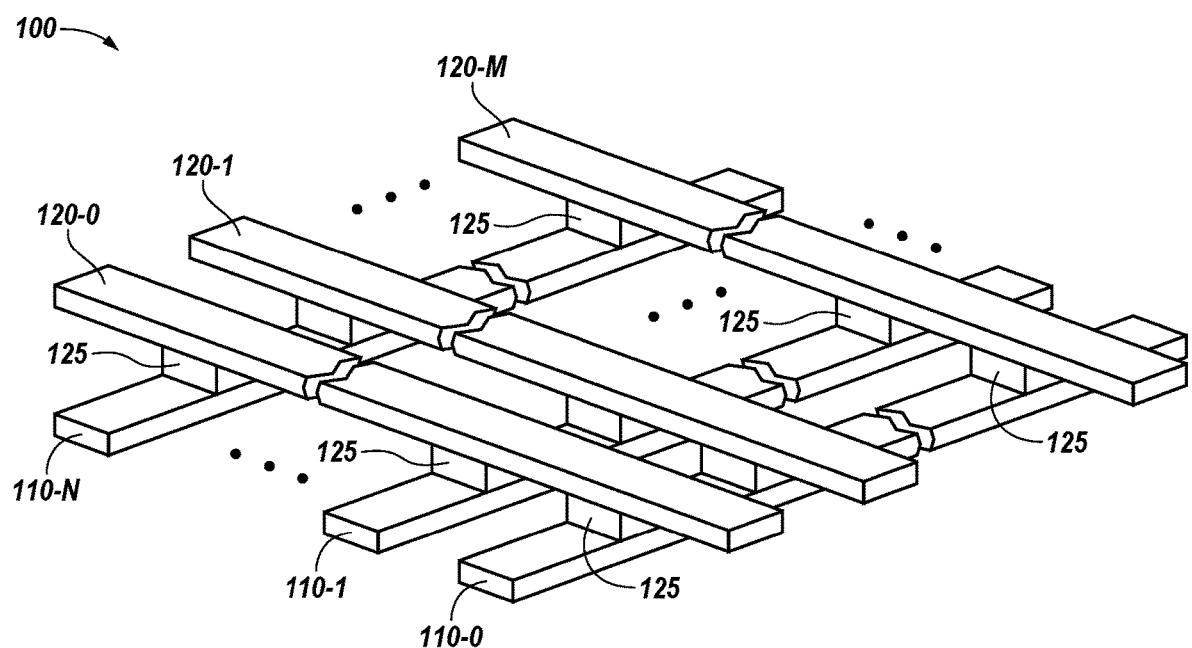
FIG. 1 is a three-dimensional view of an example of a memory array, in accordance with an embodiment of the present disclosure.

The present disclosure includes apparatuses, methods, and systems for increase of a sense current in memory. An embodiment includes a memory having a plurality of memory cells, and circuitry configured to count a number of program operations performed on the memory cells of the memory during operation of the memory, and increase a magnitude of a current used to sense a data state of the memory cells of the memory upon the count of the number of program operations reaching a threshold count.

During the sensing of a resistance variable memory cell, such as a self-selecting memory cell, a voltage may be applied to the memory cell, and the data state of the cell can be determined based on the amount of current that flows through the cell in response to the applied voltage. For example, when the voltage is applied to the memory cell, the resulting amount of current that is on a signal line (e.g., bit line or word line) to which the memory cell is coupled can be compared to a reference current, and the state of the memory cell can be determined based on the comparison. For instance, the cell can be determined to be in a first (e.g., reset) data state if the comparison indicates the signal line current is less than the reference current, and the cell can be determined to be in a second (e.g., set) data state if the comparison indicates the signal line current is greater than the reference current.

During such a sense operation, however, other (e.g., unselected) memory cells that are coupled to the same signal line as the memory cell that is being sensed may leak additional current on the signal line. This leakage current may result from, for instance, degradation and/or wear on the memory cells that occurs as the cells are continuously programmed throughout the operation of the memory. This leakage current may cause the memory cell that is being sensed (e.g., the selected cell) to be determined to be in a different data state than the state to which the cell is actually programmed. For instance, this leakage current may cause a selected memory cell that is programmed to the first data state to be erroneously determined to be in the second data state, because the addition of the leakage current to the current that flows through selected cell could increase the total amount of current on the signal line to be greater than the reference current. Such erroneous data sensing can reduce the performance and/or lifetime of the memory, and may be more severe in memory having an increased memory cell density.

Embodiments of the present disclosure, however, can compensate for this leakage current by increasing (e.g., dynamically increasing) the reference current to a magnitude that can be used to accurately distinguish between the two data states. For example, embodiments of the present disclosure can determine when an increase of the reference current may be needed due to such leakage current, and increase the magnitude of the reference current accordingly. As such, embodiments of the present disclosure can increase the performance and/or lifetime of the memory as compared with previous approaches (e.g., approaches that utilize a static reference current whose magnitude is not adjusted during operation of the memory), while allowing for increased memory cell density.

As used herein, "a", "an", or "a number of" can refer to one or more of something, and "a plurality of" can refer to two or more such things. For example, a memory device can refer to one or more memory devices, and a plurality of memory devices can refer to two or more memory devices. Additionally, the designators "N" and "M", as used herein, particularly with respect to reference numerals in the drawings, indicates that a number of the particular feature so designated can be included with a number of embodiments of the present disclosure.

The figures herein follow a numbering convention in which the first digit or digits correspond to the drawing figure number and the remaining digits identify an element or component in the drawing. Similar elements or components between different figures may be identified by the use of similar digits.

FIG. 1 is a three-dimensional view of an example of a memory array 100 (e.g., a cross-point memory array), in accordance with an embodiment of the present disclosure. Memory array 100 may include a plurality of first signal lines (e.g., first access lines), which may be referred to as word lines 110-0 to 110-N, and a plurality of second signal lines (e.g., second access lines), which may be referred to as bit lines 120-0 to 120-M) that cross each other (e.g., intersect in different planes). For example, each of word lines 110-0 to 110-N may cross bit lines 120-0 to 120-M. A memory cell 125 may be between the bit line and the word line (e.g., at each bit line/word line crossing).

The memory cells 125 may be resistance variable memory cells, for example. The memory cells 125 may include a material programmable to different data states. In some examples, each of memory cells 125 may include a single material, between a top electrode (e.g., top plate) and a bottom electrode (e.g., bottom plate), that may serve as a select element (e.g., a switching material) and a storage element, so that each memory cell 125 may act as both a selector device and a memory element. Such a memory cell may be referred to herein as a self-selecting memory cell. For example, each memory cell may include a chalcogenide material that may be formed of various doped or undoped materials, that may or may not be a phase-change material, and/or that may or may not undergo a phase change during reading and/or writing the memory cell. Chalcogenide materials may be materials or alloys that include at least one of the elements S, Se, and Te. Chalcogenide materials may include alloys of S, Se, Te, Ge, As, Al, Sb, Au, indium (In), gallium (Ga), tin (Sn), bismuth (Bi), palladium (Pd), cobalt (Co), oxygen (O), silver (Ag), nickel (Ni), platinum (Pt). Example chalcogenide materials and alloys may include, but are not limited to, Ge—Te, In—Se, Sb—Te, Ga—Sb, In—Sb, As—Te, Al—Te, Ge—Sb—Te, Te—Ge—As, In—Sb—Te, Te—Sn—Se, Ge—Se—Ga, Bi—Se—Sb, Ga—Se—Te, Sn—Sb—Te, In—Sb—Ge, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Sb—Se—Te, Ge—Sn—Sb—Te, Ge—Te—Sn—Ni, Ge—Te—Sn-βd, or Ge—Te—Sn—Pt. Example chalcogenide materials can also include SAG-based glasses NON phase change materials such as SeAsGe. The hyphenated chemical composition notation, as used herein, indicates the elements included in a particular compound or alloy and is intended to represent all stoichiometries involving the indicated elements. For example, Ge—Te may include GexTey, where x and y may be any positive integer.

In various embodiments, the threshold voltages of memory cells 125 may snap back in response to a magnitude of an applied voltage differential across them exceeding their threshold voltages. Such memory cells may be referred to as snapback memory cells. For example, a memory cell 125 may change (e.g., snap back) from a non-conductive (e.g., high impedance) state to a conductive (e.g., lower impedance) state in response to the applied voltage differential exceeding the threshold voltage. For example, a memory cell snapping back may refer to the memory cell transitioning from a high impedance state to a lower impedance state responsive to a voltage differential applied across the memory cell being greater than the threshold voltage of the memory cell. A threshold voltage of a memory cell snapping back may be referred to as a snapback event, for example.

The architecture of memory array 100 may be referred to as a cross-point architecture in which a memory cell is formed at a topological cross-point between a word line and a bit line as illustrated in FIG. 1. Such a cross-point architecture may offer relatively high-density data storage with lower production costs compared to other memory architectures. For example, the cross-point architecture may have memory cells with a reduced area and, resultantly, an increased memory cell density compared to other architectures.

Embodiments of the present disclosure, however, are not limited to the example memory array architecture illustrated in FIG. 1. For example, embodiments of the present disclosure can include a three-dimensional memory array having a plurality of vertically oriented (e.g., vertical) access lines and a plurality of horizontally oriented (e.g., horizontal) access lines. The vertical access lines can be bit lines arranged in a pillar-like architecture, and the horizontal access lines can be word lines arranged in a plurality of conductive planes or decks separated (e.g., insulated) from each other by a dielectric material. The chalcogenide material of the respective memory cells of such a memory array can be located at the crossing of a respective vertical bit line and horizontal word line.

Further, in some architectures (not shown), a plurality of first access lines may be formed on parallel planes or tiers parallel to a substrate. The plurality of first access lines may be configured to include a plurality of holes to allow a plurality of second access lines formed orthogonally to the planes of first access lines, such that each of the plurality of second access lines penetrates through a vertically aligned set of holes (e.g., the second access lines vertically disposed with respect to the planes of the first access lines and the horizontal substrate). Memory cells including a storage element (e.g., self-selecting memory cells including a chalcogenide material) may be formed at the crossings of first access lines and second access lines (e.g., spaces between the first access lines and the second access lines in the vertically aligned set of holes). In a similar fashion as described above, the memory cells (e.g., self-selecting memory cells including a chalcogenide material) may be operated (e.g., read and/or programmed) by selecting respective access lines and applying voltage or current pulses.

Figure 2A:
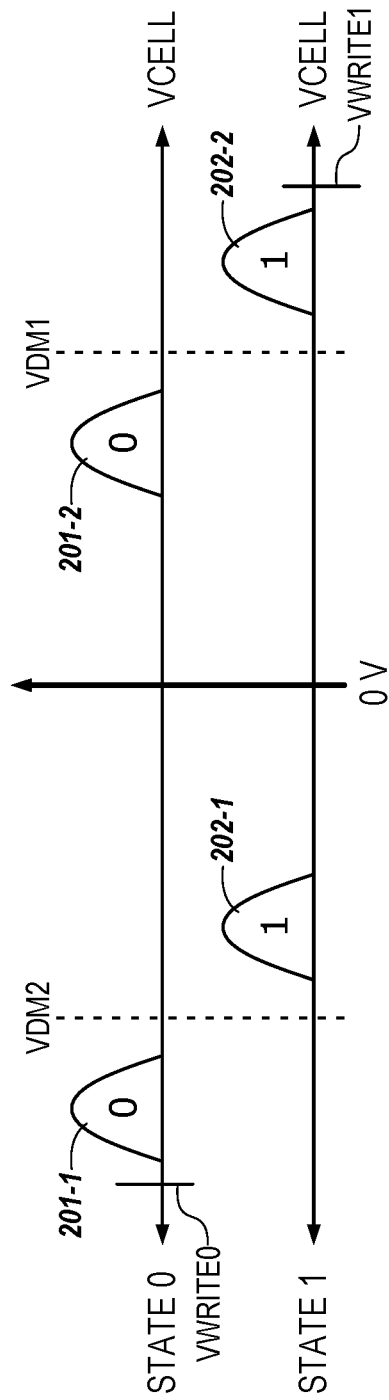
FIG. 2A illustrates threshold voltage distributions associated with various states of memory cells, in accordance with an embodiment of the present disclosure.

FIG. 2A illustrates threshold distributions associated with various states of memory cells, such as memory cells 125 illustrated in FIG. 1, in accordance with an embodiment of the present disclosure. For instance, as shown in FIG. 2A, the memory cells can be programmed to one of two possible data states (e.g., state 0 or state 1). That is, FIG. 2A illustrates threshold voltage distributions associated with two possible data states to which the memory cells can be programmed.

In FIG. 2A, the voltage VCELL may correspond to a voltage differential applied to (e.g., across) the memory cell, such as the difference between a bit line voltage (VBL) and a word line voltage (VWL) (e.g., VCELL=VBL−VWL). The threshold voltage distributions (e.g., ranges) 201-1, 201-2, 202-1, and 202-2 may represent a statistical variation in the threshold voltages of memory cells programmed to a particular state. The distributions illustrated in FIG. 2A correspond to the current versus voltage curves described further in conjunction with FIGS. 2B and 2C, which illustrate snapback asymmetry associated with assigned data states.

Figure 2B:
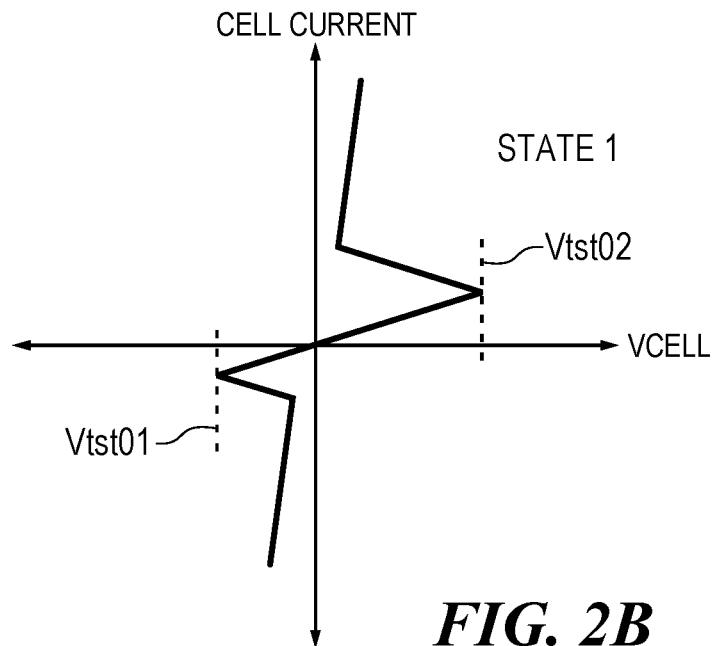
FIG. 2B is an example of a current-versus-voltage curve corresponding to a memory state of FIG. 2A, in accordance with an embodiment of the present disclosure.
Figure 2C:
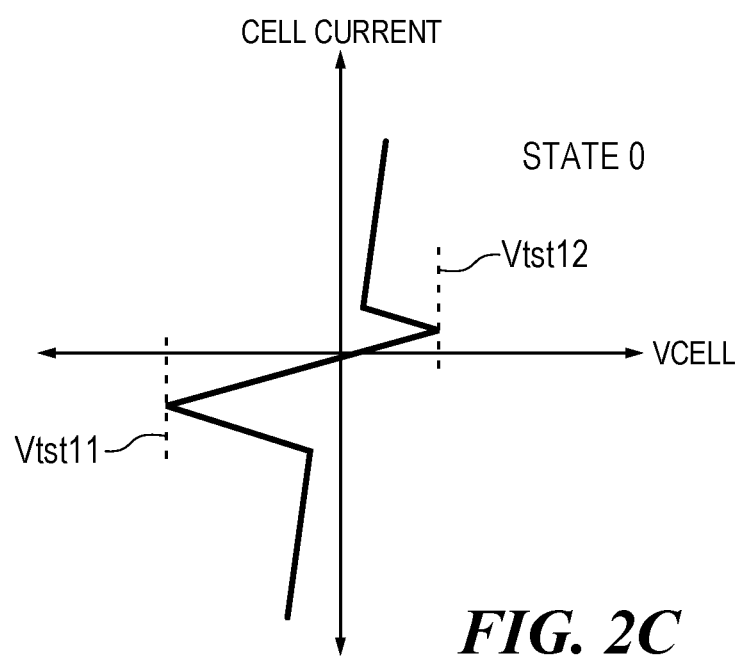
FIG. 2C is an example of a current-versus-voltage curve corresponding to another memory state of FIG. 2A, in accordance with an embodiment of the present disclosure.

In some examples, the magnitudes of the threshold voltages of a memory cell 125 in a particular state may be asymmetric for different polarities, as shown in FIGS. 2A, 2B and 2C. For example, the threshold voltage of a memory cell 125 programmed to a reset state (e.g., state 0) or a set state (e.g., state 1) may have a different magnitude in one polarity than in an opposite polarity. For instance, in the example illustrated in FIG. 2A, a first data state (e.g., state 0) is associated with a first asymmetric threshold voltage distribution (e.g., threshold voltage distributions 201-1 and 201-2) whose magnitude is greater for a negative polarity than a positive polarity, and a second data state (e.g., state 1) is associated with a second asymmetric threshold voltage distribution (e.g., threshold voltage distributions 202-1 and 202-2) whose magnitude is greater for a positive polarity than a negative polarity. In such an example, an applied voltage magnitude sufficient to cause a memory cell 125 to snap back can be different (e.g., higher or lower) for one applied voltage polarity than the other.

FIG. 2A illustrates demarcation voltages VDM1 and VDM2, which can be used to determine the state of a memory cell (e.g., to distinguish between states as part of a read operation). In this example, VDM1 is a positive voltage used to distinguish cells in state 0 (e.g., in threshold voltage distribution 201-2) from cells in state 1 (e.g., threshold voltage distribution 202-2). Similarly, VDM2 is a negative voltage used to distinguish cells in state 1 (e.g., threshold voltage distribution 202-1) from cells in state 0 (e.g., threshold voltage distribution 201-1). In the examples of FIGS. 2A-2C, a memory cell 125 in a positive state 1 does not snap back in response to applying VDM1; a memory cell 125 in a positive state 0 snaps back in response to applying VDM1; a memory cell 125 in a negative state 1 snaps back in response to applying VDM2; and a memory cell 125 in a negative state 0 does not snap back in response to applying VDM2.

Embodiments are not limited to the example shown in FIG. 2A. For example, the designations of state 0 and state 1 can be interchanged (e.g., distributions 201-1 and 201-2 can be designated as state 1 and distributions 202-1 and 202-2 can be designated as state 0).

FIGS. 2B and 2C are examples of current-versus-voltage curves corresponding to the memory states of FIG. 2A, in accordance with an embodiment of the present disclosure. As such, in this example, the curves in FIGS. 2B and 2C correspond to cells in which state 1 is designated as the higher threshold voltage state in a particular polarity (positive polarity direction in this example), and in which state 0 is designated as the higher threshold voltage state in the opposite polarity (negative polarity direction in this example). As noted above, the state designation can be interchanged such that state 0 could correspond to the higher threshold voltage state in the positive polarity direction with state 1 corresponding to the higher threshold voltage state in the negative direction.

FIGS. 2B and 2C illustrate memory cell snapback as described herein. VCELL can represent an applied voltage across the memory cell. For example, VCELL can be a voltage applied to a top electrode corresponding to the cell minus a voltage applied to a bottom electrode corresponding to the cell (e.g., via a respective word line and bit line). As shown in FIG. 2B, responsive to an applied positive polarity voltage (VCELL), a memory cell programmed to state 1 (e.g., threshold voltage distribution 200-2) is in a non-conductive state until VCELL reaches voltage Vtst02, at which point the cell transitions to a conductive (e.g., lower resistance) state. This transition can be referred to as a snapback event, which occurs when the voltage applied across the cell (in a particular polarity) exceeds the cell's threshold voltage. Accordingly, voltage Vtst02 can be referred to as a snapback voltage. In FIG. 2B, voltage Vtst01 corresponds to a snapback voltage for a cell programmed to state 1 (e.g., threshold voltage distribution 202-1). That is, as shown in FIG. 2B, the memory cell transitions (e.g., switches) to a conductive state when VCELL exceeds Vtst01 in the negative polarity direction.

Similarly, as shown in FIG. 2C, responsive to an applied negative polarity voltage (VCELL), a memory cell programmed to state 0 (e.g., threshold voltage distribution 201-1) is in a non-conductive state until VCELL reaches voltage Vtst11, at which point the cell snaps back to a conductive (e.g., lower resistance) state. In FIG. 2C, voltage Vtst12 corresponds to the snapback voltage for a cell programmed to state 0 (e.g., threshold voltage distribution 201-2). That is, as shown in FIG. 2C, the memory cell snaps back from a high impedance non-conductive state to a lower impedance conductive state when VCELL exceeds Vtst12 in the positive polarity direction.

In various instances, a snapback event can result in a memory cell switching states. For instance, if a VCELL exceeding Vtst02 is applied to a state 1 cell, the resulting snapback event may reduce the threshold voltage of the cell to a level below VDM1, which would result in the cell being read as state 0 (e.g., threshold voltage distribution 201-2). As such, in a number of embodiments, a snapback event can be used to write a cell to the opposite state (e.g., from state 1 to state 0 and vice versa).

As memory cells memory cells 125 are repeatedly programmed (e.g., written) to different data states, the magnitudes of their snapback voltages (e.g., Vtst 01, Vtst 02, Vtst11, and Vtst12) may decrease due to the stress caused by continuously applying the programming voltages to the electrodes of the cells, which in turn may make it easier for the cells to snap back. This reduction in the snapback voltage of a memory cell may cause the cell to leak current during a sense (e.g., read) operation in which the cell is an unselected cell coupled to the same access (e.g., bit) line as the selected cell whose data state is being determined, particularly if the cell is programmed to the set state (e.g., state 1). If this leakage current is not compensated for in a manner as will be further described herein, the selected cell may be sensed to be in a different data state than the state to which the cell was actually programmed. For instance, if this leakage current is not compensated for in a manner as will be further described herein, a memory cell that is programmed to the reset state (e.g., state 0) may erroneously be sensed to be in the set state (e.g., state 1).

Figure 3:
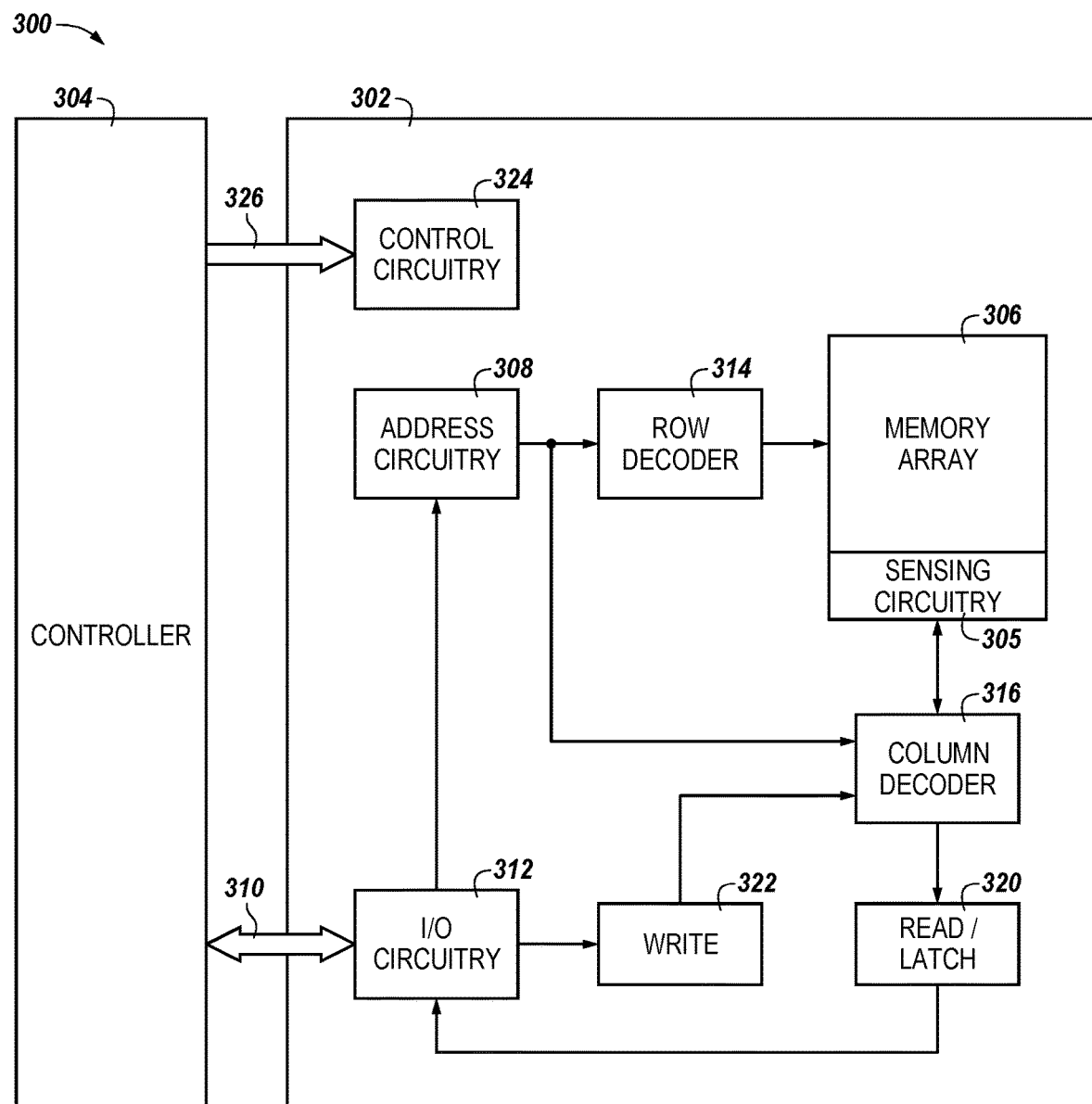
FIG. 3 is a block diagram illustration of an example apparatus, in accordance with an embodiment of the present disclosure.

FIG. 3 is a block diagram illustration of an example apparatus, such as an electronic memory system 300, in accordance with an embodiment of the present disclosure. Memory system 300 may include an apparatus, such as a memory device 302 and a controller 304, such as a memory controller (e.g., a host controller). Controller 304 might include a processor, for example. Controller 304 might be coupled to a host, for example, and may receive command signals (or commands), address signals (or addresses), and data signals (or data) from the host and may output data to the host.

Memory device 302 includes a memory array 306 of memory cells. For example, memory array 306 may include one or more of the memory arrays, such as a cross-point array, of memory cells disclosed herein. Memory device 302 may include address circuitry 308 to latch address signals provided over I/O connections 310 through I/O circuitry 312. Address signals may be received and decoded by a row decoder 314 and a column decoder 316 to access the memory array 306. For example, row decoder 314 and/or column decoder 316 may include drivers.

Memory device 302 may sense (e.g., read) data in memory array 306 by sensing voltage and/or current changes in the memory array columns using sense/buffer circuitry that in some examples may be read/latch circuitry 320. Read/latch circuitry 320 may read and latch data from the memory array 306. Sensing circuitry 305 may include a number of sense amplifiers coupled to memory cells of memory array 306, which may operate in combination with the read/latch circuitry 320 to sense (e.g., read) memory states from targeted memory cells, as will be further described herein. I/O circuitry 312 may be included for bi-directional data communication over the I/O connections 310 with controller 304. Write circuitry 322 may be included to write data to memory array 306.

Control circuitry 324 may decode signals provided by control connections 326 from controller 304. These signals may include chip signals, write enable signals, and address latch signals that are used to control the operations on memory array 306, including data read and data write operations.

Control circuitry 324 may be included in controller 304, for example. Controller 304 may include other circuitry, firmware, software, or the like, whether alone or in combination. Controller 304 may be an external controller (e.g., in a separate die from the memory array 306, whether wholly or in part) or an internal controller (e.g., included in a same die as the memory array 306). For example, an internal controller might be a state machine or a memory sequencer.

In some examples, controller 304 may be configured to increase the magnitude of a current used to sense the data state of the memory cells of memory array 306, in order to compensate for leakage current from unselected memory cells of the array coupled to the same access (e.g., bit) line as the memory cell whose state is being sensed. This current can be, for example, a current that is compared to the current on the access line to which the selected memory cell is coupled to determine the state of the selected cell. Such a current may be referred to herein as a "sense current", and its use in sensing the data state of a memory cell will be further described herein (e.g., in connection with FIG. 4).

For example, the amount of leakage current may increase as program (e.g., write) operations are continuously performed on the memory cells of memory array 306, as previously described herein. Accordingly, in an embodiment of the present disclosure, the magnitude (e.g., amplitude) of the sense current may be increased when the number of program operations performed on the memory cells of memory array 306 reaches a threshold count. For example, controller 304 can count the number of program operations performed on the memory cells during operation of memory device 302, and increase the magnitude of the sense current upon the count reaching a threshold count. For instance, controller 304 can increase the magnitude of the sense current each time the count reaches the threshold count (e.g., the magnitude can be increased a first time upon the count reaching the threshold count the first time, then subsequently increased again a second time upon the count reaching the threshold count again the second time, then subsequently increased again a third time upon the count reaching the threshold count again the third time, etc.)

Controller 304 can count the number of program operations being performed using, for instance, a counter (not shown in FIG. 3 for simplicity and so as not to obscure embodiments of the present disclosure). For instance, the counter can be included in controller 304. The counter can be reset (e.g., to zero) each respective time the count reaches the threshold count.

In an example, the threshold count can remain the same for each time (e.g., the threshold count may not change each time the counter is reset to zero). As an example, the threshold count may be 1,000 program operations (e.g., controller 304 may increase the magnitude of the sense current every thousandth program operation).

In an additional example, the threshold count can increase upon the number of program operations reaching the threshold count. For instance, the threshold voltage may increase each time the number of program operations reaches the threshold count (e.g., the threshold count may increase each time the counter is reset to zero). As an example, the initial threshold count may be 1,000 program operations, and upon that threshold count being reached, the threshold count can be increased to 10,000 program operations (e.g., controller 304 may increase the magnitude of the sense current after the first thousand program operations, and then increase the magnitude of the sense current every ten-thousandth program operation).

In an example, the magnitude of the sense current can be increased by the same amount each time the threshold count is reached. As an example, the magnitude of the sense current can be increased by 1.25 microAmps (μA) each time the threshold count is reached.

In an additional example, the amount by which the magnitude of the sense current is increased can increase upon the threshold count being reached. For instance, the amount by which the magnitude of the sense current is increased can increase each time the threshold count is reached. As an example, the magnitude of the sense current can be increased by 1.25 μA the first time the threshold count is reached, and then be increased by 5 µA each subsequent time the threshold count is reached.

After the threshold count has been reached and the magnitude of the sense current has been increased, controller 304 can sense the data state of the memory cells of memory array 306 using the increased-magnitude sense current. Using the increased-magnitude sense current to sense the data state of the cells can compensate for leakage current from unselected memory cells, as previously described herein.

In an embodiment of the present disclosure, the magnitude of the sense current may be increased when the error rate (e.g., the bit error rate) associated with data sensed using a particular demarcation voltage (VDM) meets or exceeds a threshold quantity (e.g., threshold error rate). Further, in such an embodiment, the magnitude of the sense current may only be increased for the portion(s) of memory array 306 in which that sensed data (e.g., the sensed data with the high error rate) is stored (e.g., the magnitude of the sense current may not be increased when being used to sense data stored in other portions of the array).

For example, the data stored in the memory cells of a portion of memory array 306 may be sensed by applying a demarcation voltage (e.g., VDM1 and/or VDM2 illustrated in FIG. 2A) to the memory cells, as previously described herein. However, in some instances, because the threshold voltage of the memory cells may drift (e.g., change) to a higher magnitude over time, an additional demarcation voltage having a magnitude that is greater than the magnitude of VDM 1 and VDM 2 may also need to be applied to the memory cells in order to sense the data stored in the cells (e.g., to distinguish between the reset and set data states). This additional demarcation voltage may be referred to herein as VDM retry, and may have a magnitude that is, for instance, 200 milliVolts (mV) greater than the magnitude of VDM 1 and/or VDM 2. In such an instance, the error rate associated with the data sensed using VDM retry would be expected to be lower than the error rate associated with the data sensed using VDM 1 and/or VDM 2, unless leakage current from unselected memory cells is present. Accordingly, the error rate associated with data sensed using VDM retry can be the error rate that is compared to the threshold error rate in order to determine whether to increase the magnitude of the sense current.

For example, controller 304 can sense the data stored in a portion of the memory cells of array 306 by applying a first sensing voltage (e.g., VDM 1 or VDM 2) to those memory cells, and then applying a second sensing voltage (e.g., VDM retry) to those cells after applying the first sensing voltage. The data can be sensed, for instance, using sensing circuitry 305, which will be further described herein (e.g., in connection with FIG. 4). For instance, the data can be sensed by comparing the magnitude of the sense current to the magnitude of the current that flows through the portion of the memory cells (e.g., on the respective access lines to which the selected memory cells are coupled) upon the second sensing voltage being applied to those cells, as will be further described herein.

Controller 304 can then determine the quantity of the sensed data that is erroneous. The quantity of the sensed data that is erroneous can be, for instance, the error rate (e.g., bit error rate) associated with the sensed data. The bit error rate can refer to the quantity of erroneous bits corresponding to an amount of erroneous data sensed from the portion of memory cells divided by the total amount of data sensed from the portion of memory cells (e.g., the sample size). As such, the bit error rate associated with the sensed data can be determined by dividing the quantity of erroneous bits by the total quantity of sensed data.

Controller 304 can increase the magnitude of the sense current upon the quantity of erroneous data meeting or exceeding a threshold quantity (e.g., upon the bit error rate associated with the sensed data meeting or exceeding a threshold bit error rate). In an example, the threshold quantity (e.g., threshold bit error rate) can be a fixed quantity, such as, for instance, $3 \times 10'$. In an additional example, the threshold bit error rate can be the bit error rate associated with data that was previously sensed by applying only the first sensing voltage to the portion of memory cells (e.g., the bit error rate associated with the data that was sensed using only VDM 1 and/or VDM 2).

In an example, the magnitude of the sense current can be increased by the same amount each time the quantity of erroneous data meets or exceeds the threshold quantity. As an example, the magnitude of the sense current can be increased by 1.25 µA each time the quantity of erroneous data meets or exceeds the threshold quantity. In an additional example, the magnitude of the sense current can be increased by a different amount each time the quantity of erroneous data meets or exceeds the threshold quantity. As an example, the magnitude of the sense current can be increased by 1.25 µA the first time the quantity of erroneous data meets or exceeds the threshold quantity, then increased by 5 µA the next time the quantity of erroneous data meets or exceeds the threshold quantity, then increased by 3.75 µA the next time the quantity of erroneous data meets or exceeds the threshold quantity.

After the threshold quantity has been met or exceeded and the magnitude of the sense current has been increased, controller 304 can sense the data state of the portion of memory cells of memory array 306 using the increased-magnitude sense current. Using the increased-magnitude sense current to sense the data state of the cells can compensate for leakage current from unselected memory cells, as previously described herein.

In some examples, controller 304 can increase the magnitude of the sense current that is used to sense only the data stored in that portion of memory cells. That is, the magnitude of the sense current may not be increased when being used to sense data stored in other portions of the memory cells of array 306 (e.g., portions that do not have the high error rate), as there may not yet be a need to compensate for leakage current in those cells.

As additional portions of memory cells of array 306 need the magnitude of the sense current used to sense data stored therein to be increased (e.g., because the error rate associated with that sensed data exceeds the threshold error rate), the magnitude of the sense current used to sense the data stored in those portions of cells can also be increased. Once enough portions of cells need the magnitude of the sense current to be increased, the magnitude of the sense current can be increased for the whole array.

For example, controller 304 can sense the data stored in additional portions of the memory cells of array 306 by applying the first sensing voltage (e.g., VDM 1 or VDM 2) to the memory cells of those portions, and then applying a second sensing voltage (e.g., VDM retry) to the cells of those portions after applying the first sensing voltage. Controller 304 can then determine the quantity of the sensed data from each respective additional portion that is erroneous (e.g., the bit error rate associated with the sensed data from each respective additional portion), and increase the magnitude of the sense current used to sense the data stored in each respective additional portion of cells upon the quantity of erroneous data stored in that respective portion meeting or exceeding a threshold quantity (e.g., upon the bit error rate associated with the sensed data stored in that respective portion meeting or exceeding a threshold bit error rate). Upon the quantity of the portions of the memory cells for which the magnitude of the sense current is increased meeting or exceeding a threshold quantity of portions, controller 304 can increase the magnitude of the sense current used to sense the data stored in all memory cells of array 306.

Figure 4:
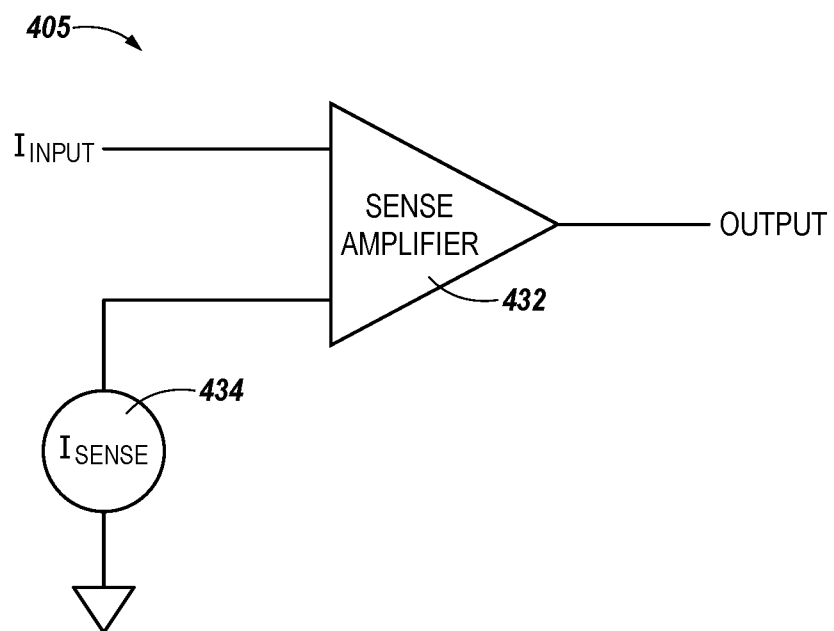
FIG. 4 illustrates example sensing circuitry, in accordance with an embodiment of the present disclosure.

FIG. 4 illustrates example sensing circuitry 405, in accordance with an embodiment of the present disclosure. Sensing circuitry 405 can be, for instance, sensing circuitry 305 previously described in connection with FIG. 3.

As shown in FIG. 4, sensing circuitry 405 can include a sense amplifier 432. Although a single sense amplifier 432 is illustrated in FIG. 4 for simplicity and so as not to obscure embodiments of the present disclosure, Sensing circuitry 405 (e.g., sensing circuitry 305) can include any number of sense amplifiers analogous to sense amplifier 432.

Sense amplifier 432 can be used to determine the state of a memory cell during a sense operation. For example, during the sense operation, a demarcation voltage (e.g., VDM1, VDM2, and/or VDM retry) can be applied to the memory cell, as previously described herein. In response to the application of the demarcation voltage, a current may flow through the cell and on the signal (e.g., access) line to which the cell is coupled, as previously described herein. The access line can be coupled to sense amplifier 432 to input this current, represented as $I_{INPUT}$ in FIG. 4, into sense amplifier 432, as shown in FIG. 4. In some examples, the magnitude of this current can be multiplied by two before being input into sense amplifier 432.

Sense amplifier 432 can compare the magnitude of $I_{INPUT}$ to the magnitude of sense current (e.g., $I_{SENSE}$) 434 shown in FIG. 4, and the result of the comparison, represented as OUTPUT in FIG. 4, can indicate the data state of the cell. For instance, if the output of sense amplifier 432 (e.g., the result of the comparison) indicates the magnitude of $I_{INPUT}$ is less than $I_{SENSE}$, the memory cell can be determined to be in a first (e.g., reset) data state, and if the output of the sense amplifier 432 indicates the magnitude of $I_{INPUT}$ is greater than $I_{SENSE}$, the memory cell can be determined to be in a second (e.g., set) data state.

During the sense operation, however, the current on the access line to which the memory cell is coupled may also include an additional leakage current from the unselected memory cells coupled to the access line, as previously described herein. The addition of this leakage current could increase the magnitude of $I_{INPUT}$ to be greater than the magnitude of sense current 434, even if the memory cell was programmed to the first (e.g., reset) data state. Accordingly, this leakage current could cause a memory cell that was programmed to the first data state to be erroneously determined to be in the second (e.g., set) data state.

Increasing the magnitude of sense current 434 in accordance with embodiments of the present disclosure, however, can compensate for this leakage current. For instance, if the magnitude of sense current 434 is increased as previously described herein, the magnitude of $I_{INPUT}$ when a memory cell that was programmed to the first data state is being sensed may be less than the magnitude of sense current 434, even with the additional leakage current. Accordingly, the memory cell can be correctly determined to be in the first data state, even with the additional leakage current.

Figure 5A:
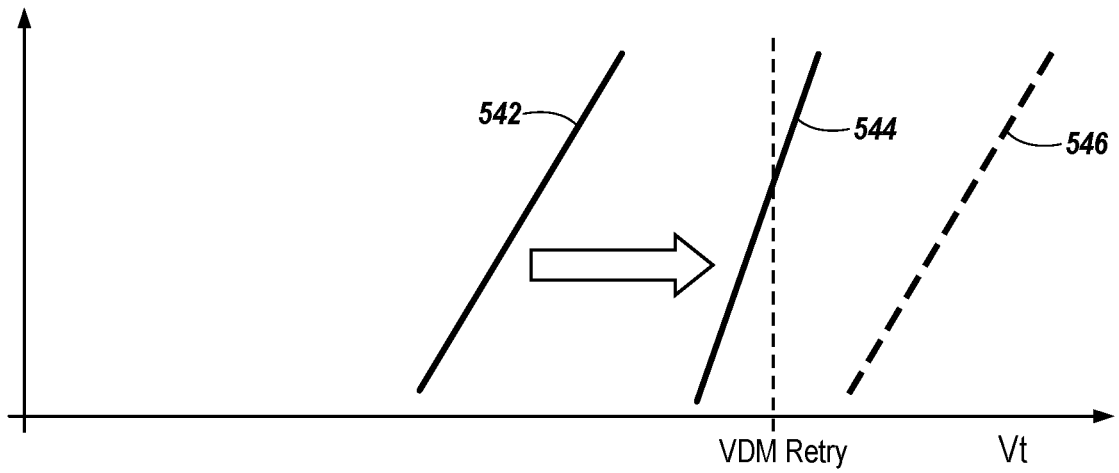
FIGS. 5A-5B illustrate a conceptual example of increasing a sense current to compensate for leakage current in memory, in accordance with an embodiment of the present disclosure.
Figure 5B:
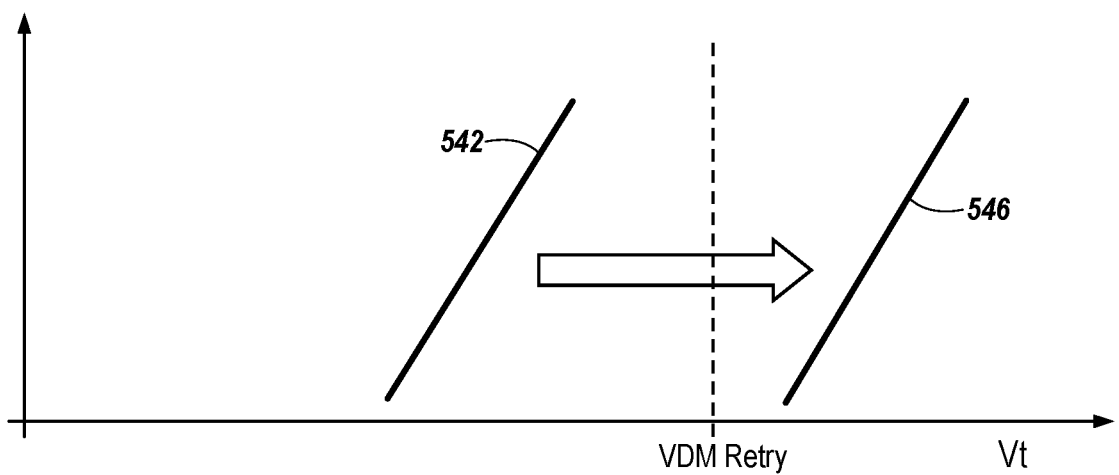

FIGS. 5A-5B illustrate a conceptual example of increasing a sense current (e.g., sense current 434 previously described in connection with FIG. 4) to compensate for leakage current in memory, in accordance with an embodiment of the present disclosure. For instance, FIG. 5A illustrates a conceptual example of threshold voltage distributions associated with a data state (e.g. a reset data state) of memory cells, such as memory cells 125 illustrated in FIG. 1, without increasing the sense current, and FIG. 5B illustrates a conceptual example of threshold voltage distributions associated with the data state of the memory cells after the sense current has been increased in accordance with the present disclosure.

For example, in FIGS. 5A and 5B, threshold voltage distribution 542 represents the threshold voltages to which the memory cells were previously programmed, and threshold voltage distribution 546 represents the present, actual threshold voltages of the memory cells to which the cells have drifted over time. However, in FIG. 5A (e.g., without an increase of the sense current), threshold voltage distribution 544 represents what the threshold voltages of the memory cells would presently appear to be, due to the leakage current, when the cells are sensed using VDM retry. As illustrated in FIG. 5A, although the threshold voltages of all the memory cells should be sensed to be greater than VDM retry (e.g., should be sensed to be within distribution 546), the threshold voltages of some of the memory cells are sensed to be less than VDM retry (e.g., a portion of distribution 544 is less than VDM retry). Accordingly, some of the memory cells (e.g., the cells whose threshold voltages are sensed to be less than VDM retry) will erroneously be determined to be in a different data state (e.g., the set data state) than the state to which they were programmed (e.g., reset data state) without an increase of the sense current.

In contrast, as illustrated in FIG. 5B (e.g., after the sense current has been increased), the threshold voltages of all the memory cells are sensed to be greater than VDM retry (e.g., the threshold voltages of the memory cells are sensed to be in distribution 546). Accordingly, all the memory cells will correctly be determined to be in the reset data state.

Although specific embodiments have been illustrated and described herein, those of ordinary skill in the art will appreciate that an arrangement calculated to achieve the same results can be substituted for the specific embodiments shown. This disclosure is intended to cover adaptations or variations of a number of embodiments of the present disclosure. It is to be understood that the above description has been made in an illustrative fashion, and not a restrictive one. Combination of the above embodiments, and other embodiments not specifically described herein will be apparent to those of ordinary skill in the art upon reviewing the above description. The scope of a number of embodiments of the present disclosure includes other applications in which the above structures and methods are used. Therefore, the scope of a number of embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment.

Thus, the following claims are hereby incorporated into the Detailed Description, with each claim standing on its own as a separate embodiment.

What is claimed is:

1. An apparatus, comprising:
a memory having a plurality of memory cells; and
circuitry configured to:
    count a number of program operations performed on the memory cells of the memory during operation of the memory; and
    increase a magnitude of a current used to sense a data state of the memory cells of the memory upon the count of the number of program operations reaching a threshold count.

2. The apparatus of claim 1, wherein the circuitry is configured to increase the magnitude of the current used to sense the data state of the memory cells a second time upon the count of the number of program operations reaching the threshold count the second time.

3. The apparatus of claim 1, wherein the circuitry is configured to increase the threshold count upon the count of the number of program operations reaching the threshold count.

4. The apparatus of claim 1, wherein the circuitry is configured to increase an amount by which the magnitude of the current used to sense the data state of the memory cells is increased upon the count of the number of program operations reaching the threshold count.

5. The apparatus of claim 1, wherein the circuitry is configured to sense the data state of a number of the memory cells of the memory using the current after increasing the magnitude of the current.

6. The apparatus of claim 5, wherein the circuitry is configured to:
    determine a bit error rate associated with the sensed data states; and
    increase the magnitude of the current upon the bit error rate associated with the sensed data meeting or exceeding a threshold bit error rate.

7. The apparatus of claim 1, wherein each of the plurality of memory cells is a self-selecting memory cell in which a single material serves as a select element and a storage element.

8. The apparatus of claim 7, wherein the single material is a chalcogenide material.

9. A method of operating memory, comprising:
counting a number of program operations performed on memory cells of a memory during operation of the memory; and
increasing a magnitude of a current used to sense a data state of the memory cells of the memory each time of a plurality of times the number of program operations reaches a threshold count.

10. The method of claim 9, where the threshold count is a same threshold count for each of the plurality of times.

11. The method of claim 9, wherein the method includes increasing the threshold count each time the number of program operations reaches the threshold count.

12. The method of claim 9, wherein the magnitude of the current used to sense the data state of the memory cells is increased by a same amount each of the plurality of times.

13. The method of claim 9, wherein the method includes increasing an amount by which the magnitude of the current used to sense the memory cells is increased each time the number of program operations reaches the threshold count.

14. The method of claim 9, wherein the data state is:
a first data state associated with a first asymmetric threshold voltage distribution whose magnitude is greater for a negative polarity than a positive polarity; or
a second data state associated with a second asymmetric threshold voltage distribution whose magnitude is greater for the positive polarity than the negative polarity.

15. An apparatus, comprising:
a memory having a plurality of memory cells; and
circuitry configured to:
    sense data stored in a portion of the plurality of memory cells by applying a first sensing voltage to the portion of the plurality of memory cells and applying a second sensing voltage to the portion of the plurality of memory cells after applying the first sensing voltage;
    determine a quantity of the sensed data that is erroneous; and
    increase a magnitude of a current used to sense the data stored in the portion of the plurality of memory cells upon the quantity of erroneous data meeting or exceeding a threshold quantity.

16. The apparatus of claim 15, wherein the first sensing voltage distinguishes memory cells of the portion in a first data state from memory cells of the portion in a second data state.

17. The apparatus of claim 15, wherein the second sensing voltage has a greater magnitude than the first sensing voltage.

18. The apparatus of claim 15, wherein the circuitry is configured to:
    sense data stored in additional portions of the plurality of memory cells by applying the first sensing voltage to the additional portions of the plurality of memory cells and applying the second sensing voltage to the additional portions of the plurality of memory cells after applying the first sensing voltage;
    determine a quantity of the sensed data stored in each respective additional portion that is erroneous; and
    increase a magnitude of a current used to sense the data stored in each respective additional portion of the plurality of memory cells upon the quantity of erroneous data stored in that respective portion meeting or exceeding the threshold quantity.

19. The apparatus of claim 18, wherein the circuitry is configured to increase a magnitude of a current used to sense the data stored in all portions of the plurality of memory cells upon a quantity of the portions of the plurality of memory cells for which the magnitude of the current is increased meets or exceeds a threshold quantity of portions.

20. A method of operating memory, comprising:
sensing data stored in a portion of a memory by applying a first sensing voltage to the portion of the memory and applying a second sensing voltage to the portion of the memory after applying the first sensing voltage;
determining a bit error rate associated with the sensed data; and
increasing a magnitude of a current used to sense the data stored in the portion of the memory upon the bit error rate associated with the sensed data meeting or exceeding a threshold bit error rate.

21. The method of claim 20, wherein the threshold bit error rate is a bit error rate associated with data stored in the portion of the memory sensed by applying only the first sensing voltage to the portion of the memory.

22. The method of claim 20, wherein increasing the magnitude of the current used to sense the data stored in the portion of the memory comprises increasing the magnitude of the current used to sense only the data stored in the portion of the memory.

23. The method of claim 20, wherein the method includes:
counting a number of program operations performed on the memory during operation of the memory; and
increasing the magnitude of the current used to sense the data stored in the portion of the memory upon the count of the number of program operations reaching a threshold count.

24. The method of claim 20, wherein sensing the data stored in the portion of the memory includes comparing a magnitude of a current that flows through the portion of the memory upon applying the second sensing voltage to the portion of the memory to the magnitude of the current used to sense the data stored in the portion of the memory.

* * * * *